United States Patent
Sekiya

(10) Patent No.: US 9,627,260 B2
(45) Date of Patent: Apr. 18, 2017

(54) WORKPIECE CUTTING METHOD USING DUMMY WAFER TO DETERMINE CONDITION OF CUTTING BLADE

(71) Applicant: DISCO CORPORATION, Tokyo (JP)

(72) Inventor: Kazuma Sekiya, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 15/077,423

(22) Filed: Mar. 22, 2016

(65) Prior Publication Data

US 2016/0284611 A1    Sep. 29, 2016

(30) Foreign Application Priority Data

Mar. 23, 2015 (JP) ................................. 2015-059571

(51) Int. Cl.

| | | |
|---|---|---|
| *H01L 21/78* | (2006.01) | |
| *H01L 21/66* | (2006.01) | |
| *B23Q 17/09* | (2006.01) | |
| *H01L 21/304* | (2006.01) | |
| *B28D 5/00* | (2006.01) | |
| *B28D 5/02* | (2006.01) | |

(52) U.S. Cl.
CPC .......... *H01L 21/78* (2013.01); *B23Q 17/0952* (2013.01); *B28D 5/0064* (2013.01); *B28D 5/022* (2013.01); *H01L 21/304* (2013.01); *H01L 21/3043* (2013.01); *H01L 22/20* (2013.01)

(58) Field of Classification Search
CPC ... H01L 21/3043; H01L 21/304; H01L 21/78; H01L 22/20
See application file for complete search history.

(56) References Cited

U.S. PATENT DOCUMENTS

| | | | | |
|---|---|---|---|---|
| 2001/0032533 A1* | 10/2001 | Sekiya | ................. | B23D 59/002 83/452 |
| 2005/0052632 A1* | 3/2005 | Miyajima | .............. | G03B 27/58 355/53 |
| 2005/0136801 A1* | 6/2005 | Sekiya | ................... | B28D 5/024 451/5 |
| 2008/0102542 A1* | 5/2008 | Negishi | ............. | H01L 21/67092 438/16 |
| 2015/0111366 A1* | 4/2015 | Cheng | .................... | B28D 5/024 438/464 |

FOREIGN PATENT DOCUMENTS

JP    2009-246015    10/2009

* cited by examiner

*Primary Examiner* — Michael Jung
(74) *Attorney, Agent, or Firm* — Greer Burns & Crain Ltd.

(57) ABSTRACT

A workpiece cutting method of cutting a workpiece having a front side on which a plurality of crossing division lines are formed to define a plurality of separate regions where a plurality of devices are each formed is disclosed. The workpiece cutting method includes a workpiece cutting step of cutting the workpiece held on a first chuck table along the division lines by using a cutting blade, a dummy wafer cutting step of cutting a dummy wafer held on a second chuck table by using the cutting blade, a dummy wafer imaging step of imaging a cut groove formed on the dummy wafer in the dummy wafer cutting step, by using an imaging unit to thereby obtain a detected image, and a determining step of determining the condition of the cutting blade from the condition of chippings formed on both sides of the cut groove in the detected image.

3 Claims, 6 Drawing Sheets

WORKPIECE CUTTING METHOD USING DUMMY WAFER TO DETERMINE CONDITION OF CUTTING BLADE

BACKGROUND OF THE INVENTION

Field of the Invention

The present invention relates to a workpiece cutting method of cutting a platelike workpiece such as a semiconductor wafer by using a cutting blade.

Description of the Related Art

A cutting apparatus including a cutting blade is used in dividing a semiconductor wafer having a plurality of semiconductor devices formed on the front side, an optical device wafer having a plurality of optical devices formed on the front side, or any platelike workpiece such as a glass substrate, ceramics substrate, and resin substrate having a plurality of devices formed on the front side to thereby obtain a plurality of individual chips. The cutting blade included in the cutting apparatus has a cutting edge, which is formed by fixing abrasive grains of diamond or the like with a plating or by fixing the abrasive grains with a bond such as metal and resin. Self-sharpening of the cutting edge is accelerated by cutting a workpiece with the cutting edge to thereby maintain constant sharpness. Cutting of the workpiece is effected by crumbling the workpiece with the abrasive grains of the cutting edge.

Thus, the cutting is effected by the crumbling, so that chipping is generated on both sides of a cut groove formed on the workpiece by using the cutting blade. If the chipping has a size extending beyond the division line where the cut groove is formed on the workpiece, defective devices may be produced. Accordingly, the cut groove is suitably imaged and observed during the operation of cutting the workpiece to inspect the size of the chipping (see Japanese Patent Laid-open No. 2009-246015, for example).

Such observation of the cut groove is called kerf inspection, wherein the size of the chipping is measured. If the size of the chipping falls out of tolerance, an error message is displayed and an operator can visually recognize the condition of the cut groove (kerf) formed on the workpiece (e.g. wafer). When it is determined that the chipping does not reach the devices, the devices are adopted as usable products, whereas when it is determined that the chipping reaches the devices, any step is taken, for example, a step of removing any unusable portion from the workpiece is taken. Furthermore, the cutting blade causing the generation of the chipping is replaced.

SUMMARY OF THE INVENTION

In the cutting operation, the condition of the cut groove varies according to the condition of the cutting edge of the cutting blade and various cutting conditions (e.g., the kind of a film formed on the workpiece, feed speed, rotational speed of the cutting blade, depth of cut, size of the abrasive grains, and kind of the bond). For example, as compared with a so-called dummy wafer (mirror wafer) on which no devices are formed, a semiconductor wafer having a plurality of low-permittivity insulator films (low-k films) formed as stacked layers on a substrate has a property such that chipping is less prone to appear on the front side of the wafer. Even when chipping appears on the front side of the wafer in this case, this chipping tends to be small chipping.

However, there may arise any abnormality not appearing on the front side of the workpiece such as a wafer. For example, cracks may be generated on the side surfaces of the cut groove. It is difficult to detect these cracks through the kerf inspection during the cutting operation.

It is therefore an object of the present invention to provide a workpiece cutting method which can quickly find any defective cutting situation that is hard to find in cutting the workpiece.

In accordance with an aspect of the present invention, there is provided a workpiece cutting method of cutting a workpiece having a front side on which a plurality of crossing division lines are formed to define a plurality of separate regions where a plurality of devices are each formed, the workpiece cutting method including a workpiece holding step of holding the workpiece on a first chuck table; a dummy wafer holding step of holding a dummy wafer on a second chuck table provided independently of the first chuck table; a workpiece cutting step of cutting the workpiece held on the first chuck table along the division lines by using a cutting blade; a dummy wafer cutting step of cutting the dummy wafer held on the second chuck table by using the cutting blade; a dummy wafer imaging step of imaging a cut groove formed on the dummy wafer in the dummy wafer cutting step, by using imaging means to thereby obtain a detected image; and a determining step of determining the condition of the cutting blade from the condition of chippings formed on both sides of the cut groove in the detected image; wherein when it is determined in the determining step that the condition of the cutting blade is normal, the workpiece cutting step is continued, whereas when it is determined in the determining step that the condition of the cutting blade is abnormal, the workpiece cutting step is stopped.

Preferably, the condition of the cutting blade is determined in the determining step according to any one of factors including the length or width of each chipping, the number of the chippings, and the area of each chipping. Preferably, the dummy wafer has a polished surface, and the dummy wafer is held on the second chuck table in the condition where the polished surface of the dummy wafer is exposed in the dummy wafer holding step.

According to the present invention, a dummy wafer having a polished surface (mirror surface) is cut with suitable timing in cutting the workpiece. Thereafter, by inspecting the condition of chippings generated on both sides of a cut groove formed on the dummy wafer, it is possible to quickly find any defective cutting situation that is hard to find in cutting the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE
PREFERRED EMBODIMENT

Figure 1:
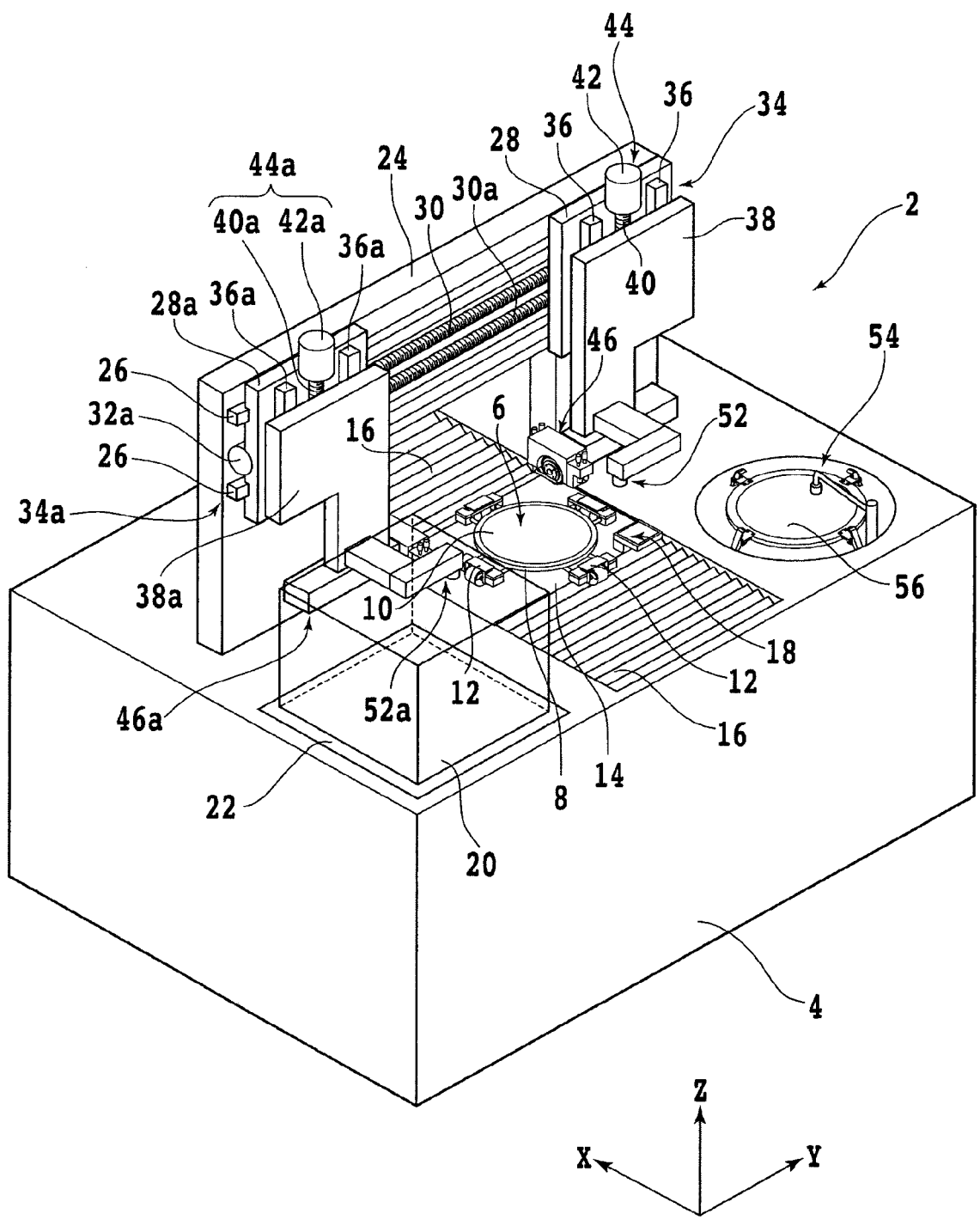
FIG. 1 is a perspective view of a cutting apparatus suitable for use in performing the workpiece cutting method of the present invention.

A preferred embodiment of the present invention will now be described in detail with reference to the drawings. Referring to FIG. 1, there is shown a perspective view of a cutting apparatus 2 suitable for use in performing the workpiece cutting method of the present invention. The cutting apparatus 2 is a facing dual spindle type cutting apparatus such that two cutting blades are provided so as to face each other.

The cutting apparatus 2 includes a base 4. The base 4 is provided with a chuck table (first chuck table) 6 adapted to be reciprocatably moved in the X direction (shown by an arrow X) by a feeding mechanism (not shown). The chuck table 6 includes a frame 8 and a suction holding portion 10 provided inside the frame 8. The frame 8 is formed of metal such as SUS, and the suction holding portion 10 is formed of porous ceramics or the like. A plurality of clamps 12 and a water cover 14 are provided around the chuck table 6. A pair of bellows 16 are provided so as to connect the water cover 14 and the base 4. A substrate chuck table (second chuck table) 18 for holding a dummy wafer is provided on the water cover 14 adjacent to the chuck table 6.

Figure 2:
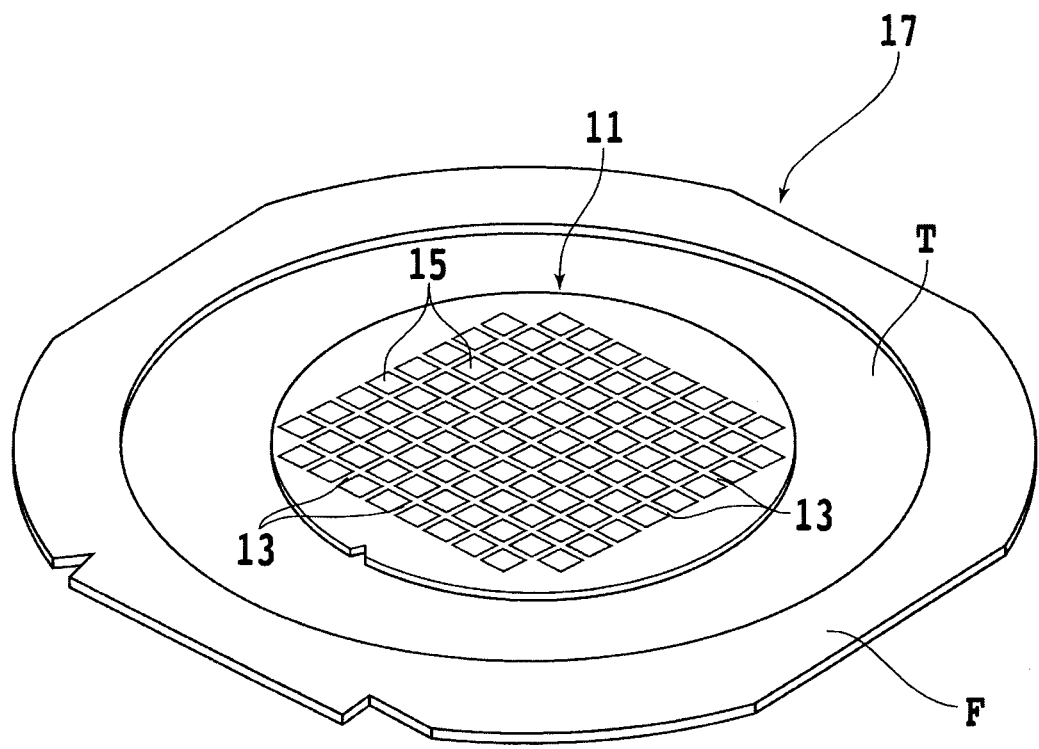
FIG. 2 is a perspective view of a wafer unit including a semiconductor wafer as a workpiece.

Referring to FIG. 2, there is shown a perspective view of a wafer unit 17. The wafer unit 17 is composed of an annular frame F, a dicing tape T attached at its peripheral portion to the annular frame F, and a semiconductor wafer (which will be hereinafter referred to also simply as wafer) 11 whose back side is attached to a central portion of the dicing tape T. A plurality of crossing division lines 13 are formed on the front side of the wafer 11 to thereby define a plurality of separate regions where a plurality of devices 15 such as ICs and LSIs are each formed. In the wafer unit 17 shown in FIG. 2, the semiconductor wafer 11 is adopted as a workpiece. However, the workpiece is not limited to the semiconductor wafer 11, but it may include any other wafers such as an optical device wafer having a plurality of optical devices formed on the front side and may also include any platelike workpiece such as a ceramics substrate and a resin substrate having a plurality of devices formed on the front side.

Referring again to FIG. 1, a plurality of such wafer units 17 are stored in a cassette 20, and this cassette 20 storing the plural wafer units 17 is placed on a vertically movable cassette elevator 22 located at a left front portion of the base 4. A gatelike column 24 having an inverted U-shape is provided at a rear portion of the base 4. A pair of guide rails 26 extending in the Y direction (shown by an arrow Y) are fixed to the column 24. A first Y moving block 28 is mounted on the column 24 so as to be movable in the Y direction by a first Y moving mechanism 34 as being guided by the guide rails 26. The first Y moving mechanism 34 is composed of a ball screw 30 and a pulse motor (not shown) for rotating the ball screw 30.

Figure 3:
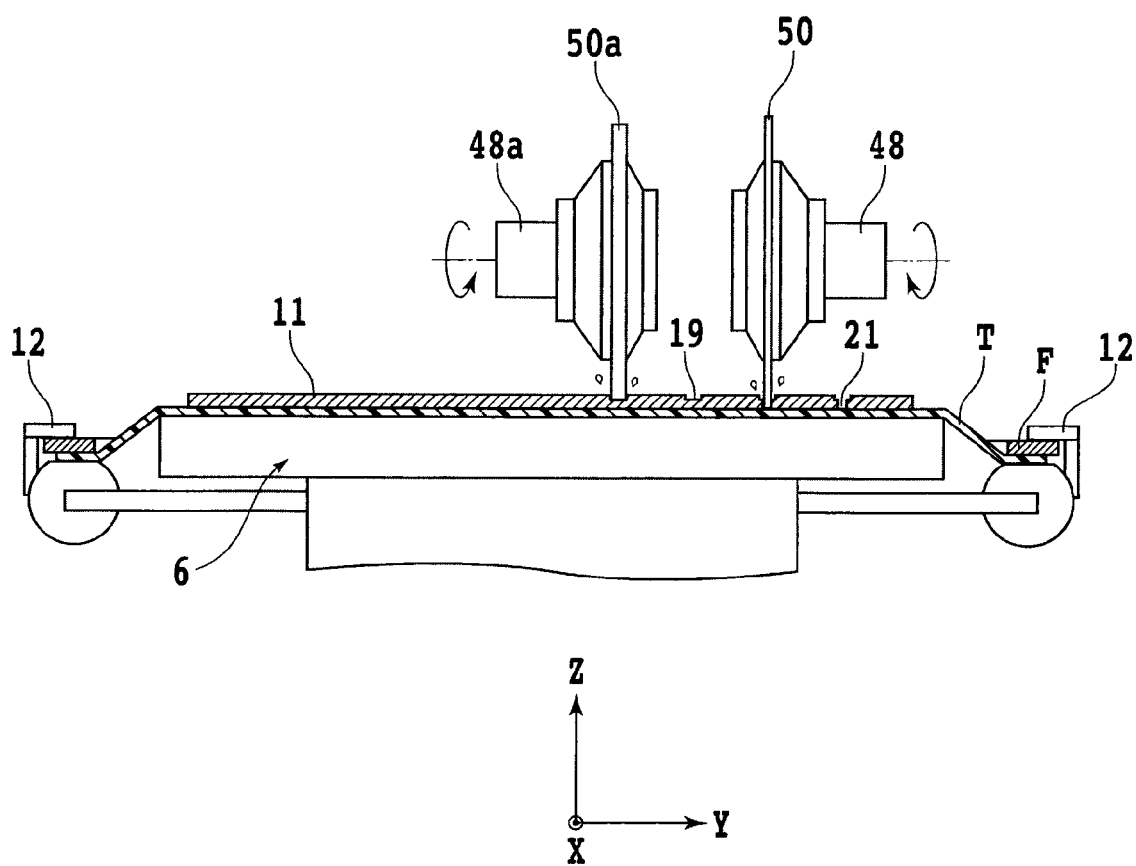
FIG. 3 is a partially sectional side view for illustrating a wafer cutting step of cutting the semiconductor wafer.

A pair of guide rails 36 extending in the Z direction (shown by an arrow Z) are fixed to the first Y moving block 28. A first Z moving block 38 is mounted on the first Y moving block 28 so as to be movable in the Z direction by a first Z moving mechanism 44 as being guided by the guide rails 36. The first Z moving mechanism 44 is composed of a ball screw 40 and a pulse motor 42 for rotating the ball screw 40. A first cutting unit 46 and a first imaging unit 52 are mounted on the first Z moving block 38. As shown in FIG. 3, the first cutting unit 46 includes a spindle 48 adapted to be rotationally driven by a motor (not shown) and a first cutting blade 50 detachably mounted on the front end portion of the spindle 48.

Referring back to FIG. 1, a second Y moving block 28a is also mounted on the column 24 so as to be movable in the Y direction by a second Y moving mechanism 34a as being guided by the guide rails 26. The second Y moving mechanism 34a is composed of a ball screw 30a and a pulse motor 32a for rotating the ball screw 30a. A pair of guide rails 36a extending in the Z direction are fixed to the second Y moving block 28a. A second Z moving block 38a is mounted on the second Y moving block 28a so as to be movable in the Z direction by a second Z moving mechanism 44a as being guided by the guide rails 36a. The second Z moving mechanism 44a is composed of a ball screw 40a and a pulse motor 42 for rotating the ball screw 40a.

A second cutting unit 46a and a second imaging unit 52a are mounted on the second Z moving block 38a. As shown in FIG. 3, the second cutting unit 46a includes a spindle 48a adapted to be rotationally driven by a motor (not shown) and a second cutting blade 50a detachably mounted on the front end portion of the spindle 48a. Referring back to FIG. 1, a spinner cleaning unit 54 having a spinner table 56 is provided at a right front portion of the base 4. In this spinner cleaning unit 54, the wafer 11 after cutting is held on the spinner table 56 under suction and then subjected to spinner cleaning. After performing the spinner cleaning, the wafer 11 is subjected to spinner drying in this spinner cleaning unit 54.

There will now be described a workpiece cutting method to be performed by using the cutting apparatus 2. First, a workpiece holding step is performed to hold the wafer 11 on the chuck table (first chuck table) 6, wherein the devices 15 are formed on the front side of the wafer 11. Further, a dummy wafer holding step is performed to hold a dummy wafer having a polished surface on the substrate chuck table (second chuck table) 18. In the dummy wafer holding step, the polished surface of the dummy wafer is exposed.

Thereafter, a workpiece cutting step is performed to cut the division lines 13 of the wafer 11 held on the chuck table 6, by using a cutting blade. That is, the wafer 11 is cut along the division lines 13. More specifically, the workpiece cutting step using the cutting apparatus 2 according to this preferred embodiment is performed by step cutting as shown in FIG. 3, wherein each division line 13 of the wafer 11 is first half-cut by the second cutting blade 50a to form a cut groove 19 having a relatively large width, and the bottom of each cut groove 19 is next full-cut by the first cutting blade 50 to form a cut groove 21 having a relatively small width. In this workpiece cutting step, the first cutting unit 46 and the second cutting unit 46a are indexed in the Y direction to sequentially perform the step cutting, thereby forming a plurality of cut grooves 21 along all of the division lines 13 extending in a first direction.

With suitable timing (e.g., after cutting 20 division lines 13) in performing the workpiece cutting step, the cut grooves 19 or 21 are imaged by the first imaging unit 52 or the second imaging unit 52a to perform kerf inspection for inspecting the size (as an example) of chipping appearing in the periphery of the cut grooves 19 or 21. Thus, as performing this kerf inspection, all of the division lines 13 extending in the first direction on the wafer 11 are sequentially cut. After cutting all of the division lines 13 extending in the first direction, the chuck table 6 is rotated 90 degrees to similarly perform the workpiece cutting step along the other division lines 13 extending in a second direction perpendicular to the first direction, thereby dividing the wafer 11 into individual device chips.

The chipping appearing on the front side of the wafer 11 can be detected by performing the kerf inspection mentioned above. However, in the case that the wafer 11 is a semiconductor wafer having a plurality of low-permittivity insulator films (low-k films) formed as stacked layers on a substrate, chipping is less prone to appear on the front side of the wafer 11. Even when chipping appears on the front side of the wafer 11 in this case, this chipping tends to be small chipping. Accordingly, even in the case that there arises any abnormality not appearing on the front side of the wafer 11, e.g., even in the case that cracks are generated on the side surfaces of the cut grooves 19 or 21, the detection of these cracks by the usual kerf inspection is difficult.

Figure 4:
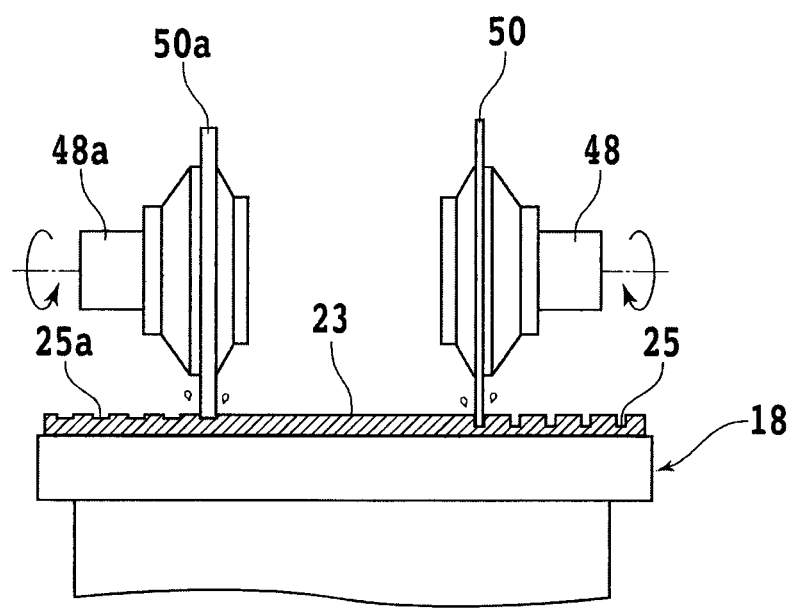
FIG. 4 is a partially sectional side view for illustrating a dummy wafer cutting step of cutting a dummy wafer.

To cope with this problem, the workpiece cutting method of the present invention includes a dummy wafer cutting step of cutting a dummy wafer with predetermined timing, e.g., by stopping the cutting step after cutting a predetermined number of wafers 11 or after continuing the cutting for a predetermined time. Alternatively, the dummy wafer cutting step may be performed before performing the cutting step of cutting the wafer 11. As shown in FIG. 4, the dummy wafer cutting step in this preferred embodiment includes the steps of cutting a dummy wafer 23 held on the substrate chuck table 18 by using the first cutting blade 50 to form a cut groove 25 and also cutting the dummy wafer 23 by using the second cutting blade 50a to form another cut groove 25a.

Figure 5A:
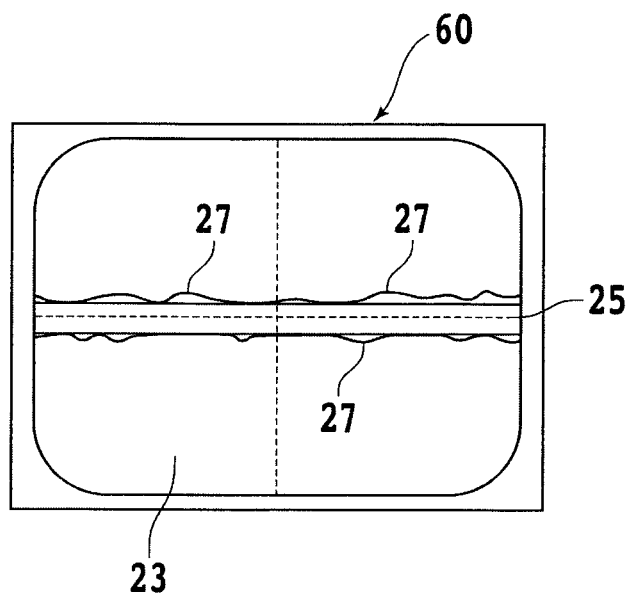
FIG. 5A is a view showing a detected image of the dummy wafer when it is determined that a cutting blade included in the cutting apparatus has no abnormality.

Thereafter, a dummy wafer imaging step is performed to image the cut grooves 25 and 25a by using either the first imaging unit 52 or the second imaging unit 52a. Referring to FIG. 5A, there is shown a detected image 60 of the cut groove 25 as obtained by the dummy wafer imaging step. As apparent from the detected image 60, relatively small chippings 27 appear in the periphery of the cut groove 25. In these relatively small chippings 27, however, the length or width of each chipping 27, the number of these chippings 27, and the area of each chipping 27 are all fall within tolerance. Accordingly, in a determining step as the next step, it is determined that the first cutting blade 50 has no abnormality.

Figure 5B:
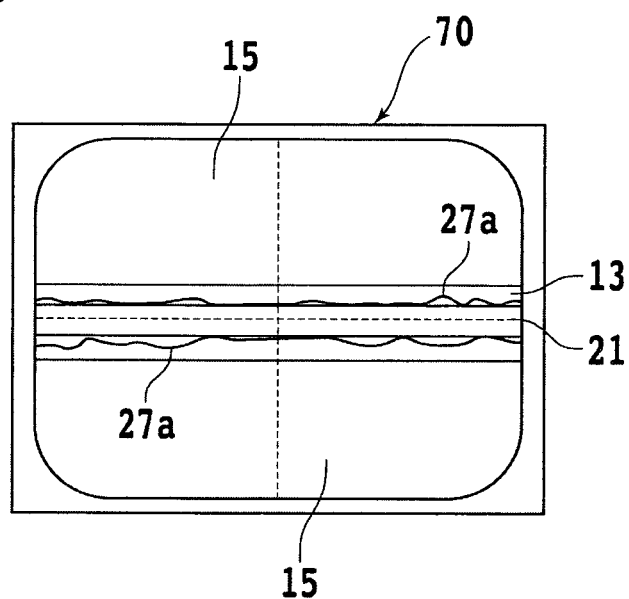
FIG. 5B is a view showing a detected image of the semiconductor wafer when it is determined that the cutting blade has no abnormality.

FIG. 5B shows a detected image 70 obtained by performing the kerf inspection for the wafer 11 in the case that it is determined in the above determining step that the first cutting blade 50 has no abnormality. As apparent from the detected image 70, relatively small chippings 27a appear in the periphery of the cut groove 21 formed on the division line 13.

Figure 6A:
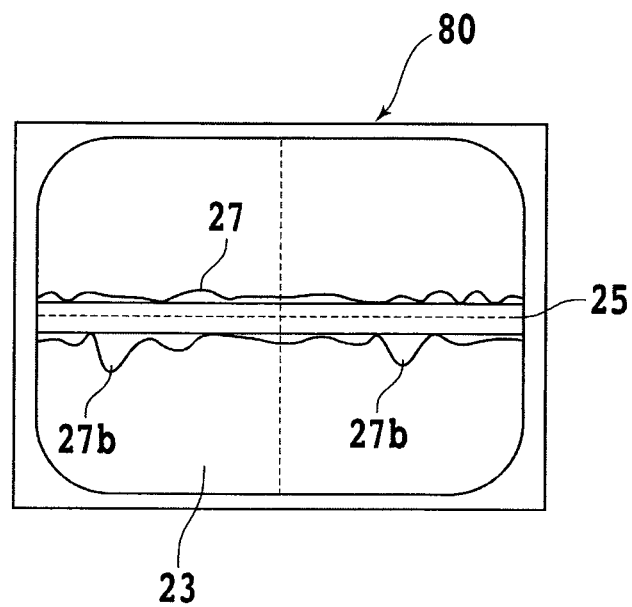
FIG. 6A is a view showing a detected image of the dummy wafer when it is determined that the cutting blade has any abnormality.

In contrast, FIG. 6A shows a detected image 80 of the cut groove 25 formed on the dummy wafer 23 in the case that it is determined in the determining step that the first cutting blade 50 has any abnormality. As apparent from the detected image 80, relatively large chippings 27b appear in the periphery of the cut groove 25, wherein any one of the length or width of each chipping 27b, the number of these chippings 27b, and the area of each chipping 27b falls out of tolerance (i.e., exceeds a tolerance limit). That is, in the case that the cutting edge of the first cutting blade 50 has any abnormality such as loading, these chippings 27b are prone to appear in cutting the dummy wafer 23 by using the first cutting blade 50, wherein any one of the length or width of each chipping 27b, the number of these chippings 27b, and the area of each chipping 27b falls out of tolerance.

Figure 6B:
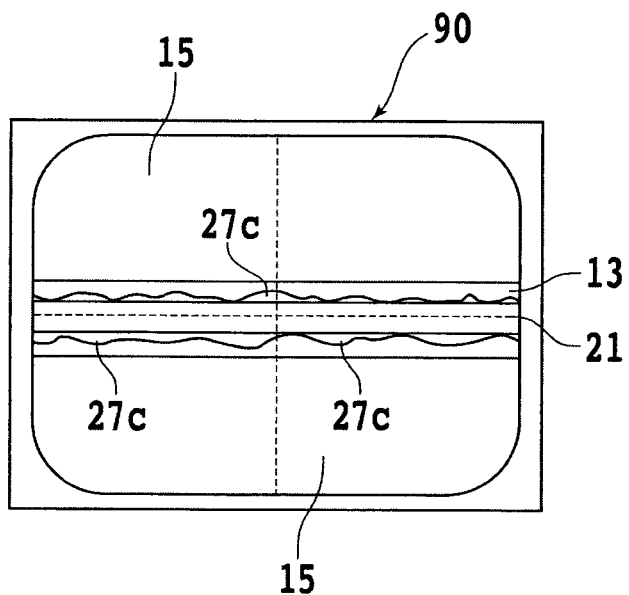
FIG. 6B is a view showing a detected image of the semiconductor wafer when it is determined that the cutting blade has any abnormality.

FIG. 6B shows a detected image 90 obtained by performing the kerf inspection for the wafer 11 in the case that it is determined in the above determining step that the first cutting blade 50 has any abnormality. As apparent from the detected image 90, relatively small chippings 27c appear on both sides of the cut groove 21. That is, although the kerf inspection for the wafer 11 is performed, the abnormality of the first cutting blade 50 cannot be detected. To solve this problem, the cutting method of the present invention includes the dummy wafer cutting step, the dummy wafer imaging step, and the determining step to detect any abnormality of the first cutting blade 50.

As similar to the case of the first cutting blade 50, it can be determined whether or not the second cutting blade 50a has any abnormality in the determining step, by imaging the cut groove 25a formed on the dummy wafer 23 in the dummy wafer imaging step.

When it is determined that both the first and second cutting blades 50 and 50a have no abnormality in the determining step, the cutting step for the wafer 11 is started again. On the other hand, when it is determined that either the first cutting blade 50 or the second cutting blade 50a has any abnormality in the determining step, the cutting step for the wafer 11 is stopped (remains stopped).

While the cutting apparatus 2 is a facing dual spindle type cutting apparatus for performing the step cutting of the wafer 11 in this preferred embodiment, the workpiece cutting method of the present invention is not limited to the above preferred embodiment, but may be similarly applied to the case of cutting the wafer 11 by using a cutting apparatus including a single cutting unit.

The cutting of the dummy wafer 23 is preferably performed under the conditions similar to those of the cutting step for the wafer 11. However, the cutting conditions for the dummy wafer 23 may be set independently so that chipping or any abnormality can be easily found as by increasing the moving speed of the substrate chuck table 18 to increase the feed speed in cutting the dummy wafer 23.

Further, while the step cutting of the wafer 11 is performed by using the first and second cutting blades 50 and 50a in the above preferred embodiment, a single cutting blade may be used to perform full cutting of the wafer 11 or half cutting of the wafer 11. Further, the area of each chipping means the area of one chipping or the total area of plural chippings generated in a measurement range.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece cutting method of cutting a workpiece having a front side on which crossing division lines are formed to define a plurality of separate regions where a plurality of devices are each formed, said workpiece cutting method comprising:

a workpiece holding step of holding said workpiece on a first chuck table; a dummy wafer holding step of holding a dummy wafer on a second chuck table provided independently of said first chuck table;

a workpiece cutting step of cutting said workpiece held on said first chuck table along said division lines by using a cutting blade;

a dummy wafer cutting step of cutting said dummy wafer held on said second chuck table by using said cutting blade;

a dummy wafer imaging step of imaging a cut groove formed on said dummy wafer in said dummy wafer cutting step, by using mounted imaging means to thereby obtain a detected image; and a determining step of determining the condition of said cutting blade from the condition of chippings formed on both sides of said cut groove in said detected image; wherein when it is determined in said determining step that the condition of said cutting blade is normal, said workpiece cutting step is continued, whereas when it is determined in said determining step that the condition of said cutting blade is abnormal, said workpiece cutting step is stopped.

2. The workpiece cutting method according to claim 1, wherein the condition of said cutting blade is determined in said determining step according to any one of factors including the length or width of each chipping, the number of said chippings, and the area of each chipping.

3. The workpiece cutting method according to claim 1, wherein said dummy wafer has a polished surface, and said dummy wafer is held on said second chuck table in the condition where said polished surface of said dummy wafer is exposed in said dummy wafer holding step.

* * * * *